(12) United States Patent
Levy

(10) Patent No.: US 7,170,817 B2
(45) Date of Patent: Jan. 30, 2007

(54) ACCESS OF TWO SYNCHRONOUS BUSSES WITH ASYNCHRONOUS CLOCKS TO A SYNCHRONOUS SINGLE PORT RAM

(75) Inventor: David Levy, Lubbeek (BE)

(73) Assignee: STMicroelectronics Belgium N. V., Zaventem (BE)

( * ) Notice: Subject to any disclaimer, the term of this patent is extended or adjusted under 35 U.S.C. 154(b) by 400 days.

(21) Appl. No.: 10/869,484

(22) Filed: Jun. 16, 2004

(65) Prior Publication Data
US 2005/0021899 A1    Jan. 27, 2005

(30) Foreign Application Priority Data
Jun. 16, 2003  (EP) .................................. 03447153

(51) Int. Cl.
*G11C 8/00*  (2006.01)
(52) U.S. Cl. .................................. 365/233; 365/189.02
(58) Field of Classification Search ........... 365/189.02, 365/233
See application file for complete search history.

(56) References Cited

U.S. PATENT DOCUMENTS

| 5,422,858 | A |   | 6/1995 | Mizukami et al. |
| 6,078,527 | A |   | 6/2000 | Roth et al. |
| 6,229,741 | B1 | * | 5/2001 | Maeno ....................... 365/200 |
| 6,683,818 | B1 | * | 1/2004 | Cornell et al. .............. 365/233 |

\* cited by examiner

*Primary Examiner*—Hoai V. Ho
(74) *Attorney, Agent, or Firm*—Lisa K. Jorgenson; Stephen Bongini; Fleit, Kain, Gibbon, Gutman, Bongini & Bianco P.L.

(57) ABSTRACT

A method and circuit are provided for controlling access of two synchronous busses with asynchronous clocks to a synchronous single port Random Access Memory (RAM). In one preferred method, the clock of bus A is switched off via a control flip-flop and then the clock of bus B is switched on, allowing the control and data signals to pass through simple multiplexers. Bus B becomes the owner of the RAM. Later, the clock of bus B is switched off via the control flip-flop and then clock of bus A is switched on, such that bus A becomes owner of the bus. This allows any relative speed between the bus clocks.

14 Claims, 3 Drawing Sheets

ACCESS OF TWO SYNCHRONOUS BUSSES WITH ASYNCHRONOUS CLOCKS TO A SYNCHRONOUS SINGLE PORT RAM

CROSS-REFERENCE TO RELATED APPLICATIONS

This application is based upon and claims priority from European Patent Application No. 03 447 153.2, filed Jun. 16, 2003, the entire disclosure of which is herein incorporated by reference.

FIELD OF THE INVENTION

The present invention is related to the access of two synchronous busses with asynchronous clocks to a synchronous single port Random Access Memory (RAM).

BACKGROUND OF THE INVENTION

A synchronous bus is a bus that has a clock and all signals on the bus are switched based on this clock. Both busses employed in embodiments of the present invention are synchronous since they both have a clock. However they are asynchronous to each other since there is no relationship between the two clocks.

There are many synchronization systems allowing different busses to access a RAM. They all start from the assumption that the relative speed of the busses is known. Some methods are suggested to synchronize a signal A to a signal B, e.g., if one knows A is at least 3 times faster than B. Other methods are used if A is at least 3 times slower than B.

In the implementation of such systems one often encounters master/slave situations: the master is writing data or code to the RAM (depending on the application) and the slave is executing the code or using the data.

The alternative solution is to use a dual port RAM, with bus A signals simply connected to port A of the RAM and bus B signals to port B of the RAM. This approach is disadvantageous in the number of gates it takes, namely twice the size of a single port RAM.

SUMMARY OF THE INVENTION

In view of these drawbacks, it is an object of the present invention to overcome the above-mentioned drawbacks and to provide a circuit and method for controlling access of two synchronous busses with asynchronous clocks with unknown relative speed to a synchronous single port Random Access Memory.

One embodiment of the present invention provides a method for controlling access of two synchronous busses with asynchronous clocks to a single port Random Access Memory (RAM). According to the method, there is provided a synchronization system comprising the two synchronous busses each being controlled by one of the clocks, and a control flip-flop that is clocked by the clock of one of the two busses so that the one bus is in control of the control flip-flop, and the other of the two busses is not in control of the control flip-flop. A change signal is provided to the control flip-flop for requesting a change of the clock of the RAM, so as to produce a control flip-flop output signal. The control flip-flop output signal is supplied to an inverter circuit that yields a first signal, and to a synchronization circuit that synchronizes the control flip-flop output signal to the clock of the bus that is not in control of the control flip-flop, so as to produce a second signal. The first signal is supplied to a first circuit to synchronize to the clock of the other bus yielding a third signal, and the second signal is supplied to a second circuit to synchronize to the clock of the other bus yielding a fourth signal. The first signal and the fourth signal are supplied to a first combinatorial block that outputs a fifth signal, and the second signal and the third signal are supplied to a second combinatorial block that outputs a sixth signal. The fifth signal is supplied to a first falling edge sampling flip-flop to yield a seventh signal, and the sixth signal is supplied to a second falling edge sampling flip-flop to yield a eighth signal. The seventh signal and the clock of the bus in control of the control flip-flop are supplied to a first AND gate, the eighth signal and the clock of the other bus are supplied to a second AND gate, and the outputs of the first and second AND gates are supplied to an OR gate. The output signal of the OR gate is used as the clock signal of the RAM.

In a preferred embodiment, the seventh and eighth signals are supplied to a third combinatorial block that outputs the select signal for selecting between the busses to control and data multiplexers used for communication with the single port RAM. Preferably, the combinatorial block comprises a protection to avoid the seventh and eighth signals being active simultaneously.

Another embodiment of the present invention provides a method for on-line clock speed modification, using the method described above.

Yet another embodiment of the present invention provides a communication device that performs the method described above.

An alternative embodiment of the present invention provides a computer device that performs the method described above.

A further embodiment of the present invention provides a control circuit for controlling access of two synchronous busses with asynchronous clocks to a single port Random Access Memory (RAM), the two synchronous busses each being controlled by one of the clocks.

Other objects, features and advantages of the present invention will become apparent from the following detailed description. It should be understood, however, that the detailed description and specific examples, while indicating preferred embodiments of the present invention, are given by way of illustration only and various modifications may naturally be performed without deviating from the present invention.

DETAILED DESCRIPTION OF PREFERRED EMBODIMENTS

The present invention relates to the access of two synchronous busses with asynchronous clocks with unknown relative speed to a synchronous single port Random Access Memory (RAM). In the preferred method of the present invention, the clock of bus A is switched off via a control flip-flop and then the clock of bus B is switched on, allowing the control and data signals to pass through simple multiplexers. Bus B becomes the owner of the RAM. Later on in the preferred method of the present invention, the clock of bus B is switched off via the control flip-flop and then clock of bus A is switched on, such that bus A becomes owner of the bus. The method of the present invention allows any relative speed between the bus clocks. Moreover, it allows an on-line modification of the clock speed: assuming clock A to be faster than clock B, it is allowed to be modified on-line, such that clock B will become faster than clock A.

Figure 1:
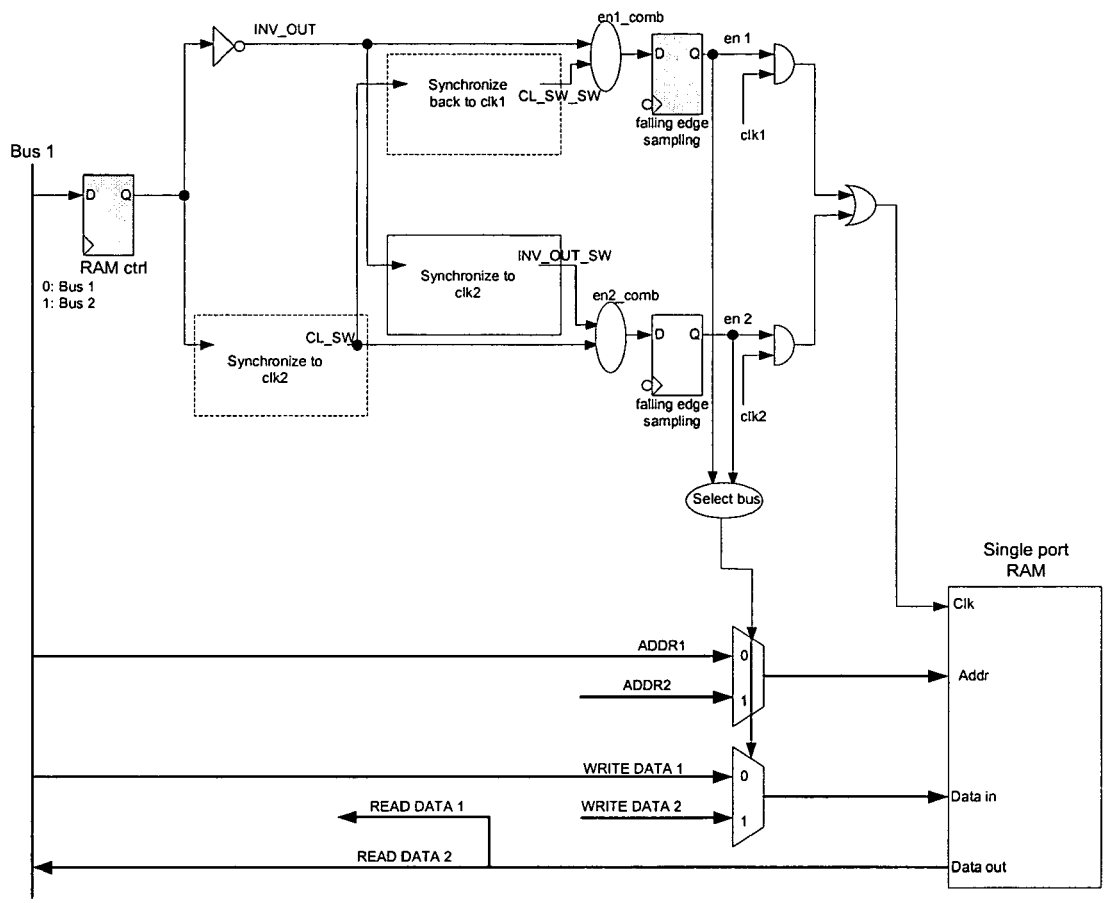
FIG. 1 represents a conceptual block diagram of one embodiment of the present invention.

The control flip-flop at the input determines which bus, A or B, is given access to the RAM. Assume the control flip-flop is clocked on the clock of bus A. FIG. 1 conceptually describes how to synchronize the bus A signal to grant access to the RAM to the relevant controller in one embodiment of the present invention. In FIG. 1, flip-flops in gray are clocked by bus A and flip-flops in white by bus B.

When a request for changing the RAM clock is received, the control flip-flop output signal is changed. It is distributed to two branches, as shown in FIG. 1. In one branch the output signal is inverted, resulting in a signal INV_OUT, and in the other branch it is supplied to a circuit to synchronize it to the clock of the other bus, in this case bus B. The latter circuit outputs a signal CL_SW. Both resulting signals, INV_OUT and CL_SW, are then each supplied directly to a first input of a combinatorial block (i.e., not involving flip-flops) in the same branch. They are also supplied to a second input of the combinatorial block in the other branch, after having passed through a circuit to synchronize the signal to the other clock, i.e., CL_SW is synchronized back to the clock of bus A yielding signal CL_SW_SW, and INV_OUT is synchronized to the clock of bus B yielding INV_OUT_SW. The ellipse shaped blocks in FIG. 1 perform combinatorial logic:

en1_comb is set high if both the bus A and bus B synchronized signals agree that the RAM must be controlled by the clock of bus A; and en2_comb is set high if both the bus A and bus B synchronized signals agree that the RAM must be controlled by the clock of bus B.

The signals coming out of the combinatorial blocks are then supplied to falling edge flip-flops. These falling edge flip-flops ensure no glitch will be present at the RAM clock input.

The output signals of the falling edge flip-flops in each branch, en1 and en2, are sent to the control and data multiplexers, possibly via another combinatorial block 'Select bus' that also ensures that if just one signal is active (either en1 or en2), the relevant bus is selected. As the longer delay on the bus A path (synchronization to bus B and synchronization back to bus A) ensures that both en1 and en2 will never be active together, the 'Select bus' block only serves as an extra protection. It is optional and not present in all embodiments of the present invention.

The en1 and en2 signals are input to an AND-gate with the respective clock signals as the second input. The output signals of both AND-gates are supplied to an OR gate, so that either the clock of bus A or the clock of clock B is selected as the single port programmable RAM clock.

Care should be taken in the layout for the gated clock. Between the input clock pin to a chip and the clock input to all flip-flops and RAMs, several buffers are inserted. These buffers are called a clock tree. The purpose of the clock tree is to ensure that all flip-flops and RAMs get the clock at the same moment, independent of their physical location in the chip. The time difference between the first and the last flip-flop/RAM getting the clock pulse is called the skew. The target of the clock tree is to minimize the skew. Some specialized design tools perform this minimization automatically. By adding the gates on the clock, as described above, the skew on the RAM clock input is deteriorated. So special care must be taken here to manually minimize the skew.

Figure 2:
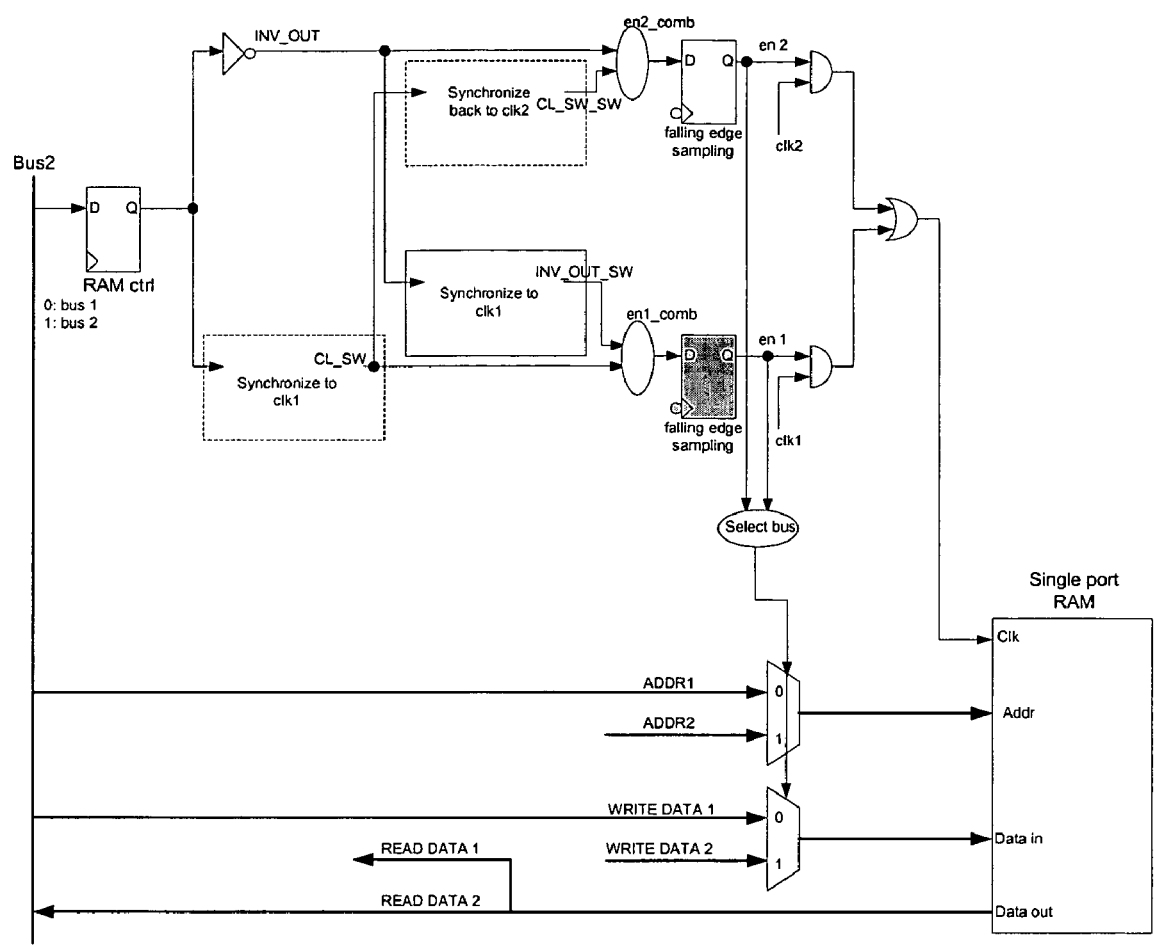
FIG. 2 represents a conceptual block diagram of an alternative embodiment of the present invention.

FIG. 2 shows a variant of the embodiment of FIG. 1. It describes a case where the control signal is clocked on bus B instead of on bus A. This implies the gray and white flip-flops are switched compared to the embodiment of FIG. 1. Again the 'Select bus' block in this figure is only used as a second protection and is not a mandatory element.

A specific example of the conceptual scheme shown in FIG. 1 is now provided. In this illustrative example, bus A is an Advanced High Performance Bus (AHB) (an external controller). Bus B is a Micro-Controller with TC ('ADSL Transmission Convergence layer') clock. The external controller (bus A) downloads the program of the Micro-Controller (bus B) to the single-port RAM. Later, the Micro-Controller accesses this RAM, among other things, to read its program. This program shall thus be accessed by both the external controller and the Micro-Controller. Note this is an example of a master/slave situation as described above. Here the master is the external controller writing a program to the RAM. The slave is the Micro-Controller executing this program.

The external controller, through the Advanced High-performance Bus (AHB), selects which of the Micro-Controller or the external controller is granted access to the RAM. If the external controller is chosen, the inputs to the RAM are the AHB signals including the AHB clock. If the Micro-Controller is chosen, the inputs to the RAM are the Micro-Controller signals and the TC clock.

Figure 3:
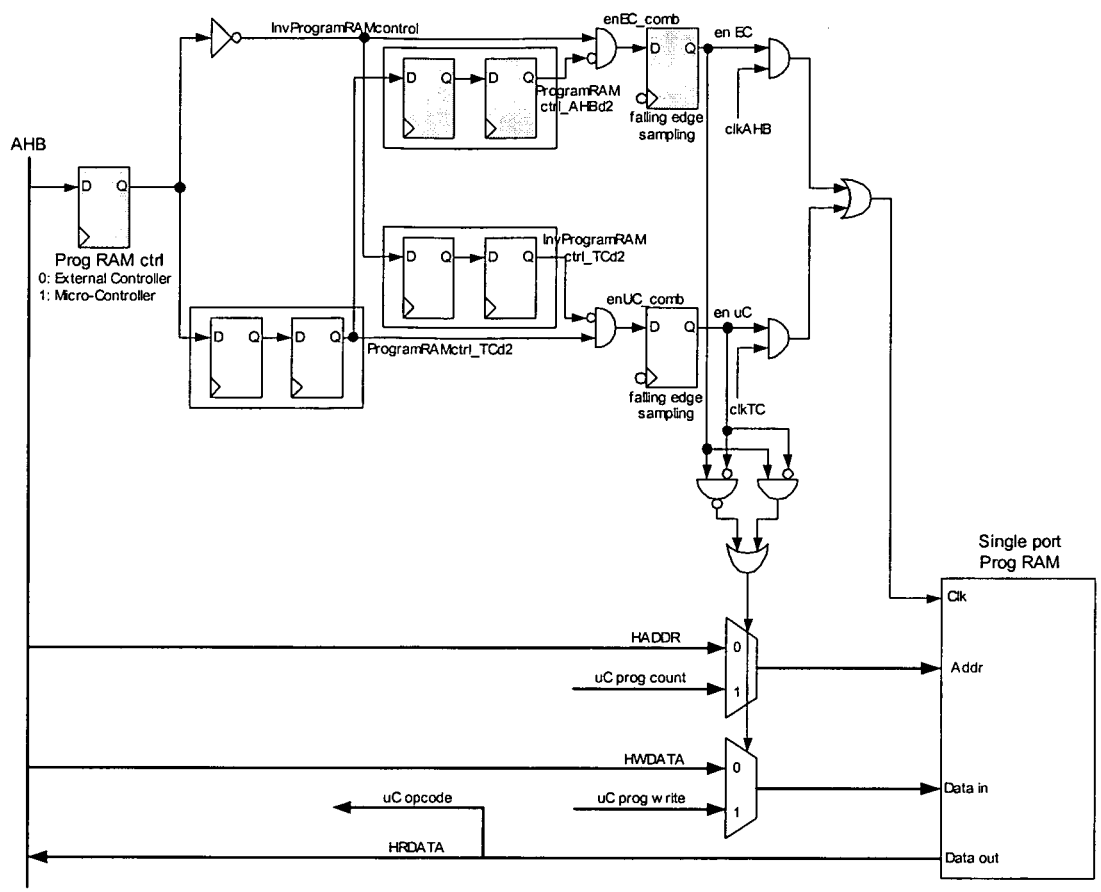
FIG. 3 represents a circuit diagram of an exemplary embodiment of the present invention.

FIG. 3 represents a circuit diagram for the exemplary embodiment of the present invention. FIG. 3 shows how to synchronize the AHB signal to grant access to the RAM to the relevant controller. Flip-flops in gray are clocked by the AHB clock. Flip-flops in white are clocked by the TC clock.

If the external controller needs to access the RAM after it has granted access to the Micro-Controller, it performs this in two steps:

1. Put the Micro-Controller in wait state; and
2. Select the External controller for program RAM access.

It can then access the RAM. To allow the Micro-Controller to continue its task, it performs this in two steps:

1. Select the Micro-Controller for program RAM access; and
2. Remove the wait state on the Micro-Controller.

Figure 4:
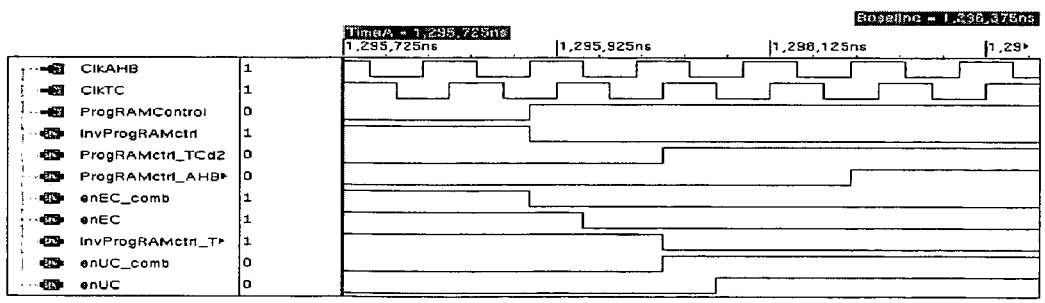
FIG. 4 represents a timing diagram showing the waveforms of the relevant signals.

The timing diagram shown in FIG. 4 describes the waveforms of the relevant signals when control is switched from the External Controller to the Micro-Controller.

The present invention can be realized in hardware, software, or a combination of hardware and software. Any processor, controller, or other apparatus adapted for carrying out the functionality described herein is suitable. A typical combination of hardware and software could include a general purpose processor (or a controller) with a computer program that, when loaded and executed, carries out the functionality described herein.

While there has been illustrated and described what are presently considered to be the preferred embodiments of the present invention, it will be understood by those skilled in the art that various other modifications may be made, and equivalents may be substituted, without departing from the true scope of the present invention. Additionally, many modifications may be made to adapt a particular situation to the teachings of the present invention without departing from the central inventive concept described herein. Furthermore, an embodiment of the present invention may not include all of the features described above. Therefore, it is intended that the present invention not be limited to the particular embodiments disclosed, but that the invention include all embodiments falling within the scope of the appended claims.

What is claimed is:

1. A method for controlling access of two synchronous busses with asynchronous clocks to a single port Random Access Memory (RAM), said method comprising the steps of:

providing a synchronization system comprising the two synchronous busses each being controlled by one of the clocks, and a control flip-flop that is clocked by the clock of one of the two busses so that the one bus is in control of the control flip-flop, and the other of the two busses is not in control of the control flip-flop;

providing a change signal to the control flip-flop for requesting a change of the clock of the RAM, so as to produce a control flip-flop output signal;

supplying the control flip-flop output signal to an inverter circuit that yields a first signal, and to a synchronization circuit that synchronizes the control flip-flop output signal to the clock of the bus that is not in control of the control flip-flop, so as to produce a second signal;

supplying the first signal to a first circuit to synchronize to the clock of the other bus yielding a third signal, and the second signal to a second circuit to synchronize to the clock of the other bus yielding a fourth signal;

supplying the first signal and the fourth signal to a first combinatorial block that outputs a fifth signal, and the second signal and the third signal to a second combinatorial block that outputs a sixth signal;

supplying the fifth signal to a first falling edge sampling flip-flop to yield a seventh signal, and the sixth signal to a second falling edge sampling flip-flop to yield a eighth signal;

supplying the seventh signal and the clock of the bus in control of the control flip-flop to a first AND gate, the eighth signal and the clock of the other bus to a second AND gate, and the outputs of the first and second AND gates to an OR gate; and using the output signal of the OR gate as the clock signal of the RAM.

2. The method as defined in claim 1, further comprising the step of using the seventh and eighth signals to control multiplexers used for communication with the single port RAM.

3. The method as defined in claim 1, further comprising the step of supplying the seventh and eighth signals to a third combinatorial block that outputs the select signal for selecting between the busses to control and data multiplexers used for communication with the single port RAM.

4. The method as defined in claim 3, wherein the third combinatorial block comprises a protection to avoid the seventh and eighth signals being active simultaneously.

5. A method for on-line clock speed modification, said method comprising the steps of:

performing the method for controlling access of the two synchronous busses with asynchronous clocks to the single port RAM as defined in claim 1; and performing an on-line modification of relative speeds the clocks such that the clock that was slower becomes faster than the clock that was faster.

6. A communication device performing the method as defined in claim 1.

7. A computer device performing the method as defined in claim 1.

8. A control circuit for controlling access of two synchronous busses with asynchronous clocks to a single port Random Access Memory (RAM), the two synchronous busses each being controlled by one of the clocks, said control circuit comprising:

a synchronization system comprising a control flip-flop that is clocked by the clock of one of the two busses so that the one bus is in control of the control flip-flop and the other of the two busses is not in control of the control flip-flop, the control flip-flop receiving a change signal flop for requesting a change of the clock of the RAM and producing a control flip-flop output signal;

a synchronization circuit coupled to the control flip-flop, the control flip-flop output signal being coupled to the synchronization circuit for synchronizing to the clock of the bus that is not in control of the control flip-flop, so as to produce a first synchronized signal;

a first circuit coupled to the synchronization circuit, the first synchronized signal being coupled to the first circuit to synchronize to the clock of the other bus yielding a second synchronized signal;

a second circuit coupled to the control flip-flop, the control flip-flop output signal being coupled to the second circuit to synchronize to the clock of the bus that is in control of the control flip-flop so as to produce a third synchronized signal;

a first combinatorial block coupled to the first circuit, the control flip-flop output signal and the second synchronized signal being coupled to the first combinatorial block so as to produce a first logic signal;

a second combinatorial block coupled to the second circuit, the first and third synchronized signals being coupled to the second combinatorial block so as to produce a second logic signal;

a first falling edge sampling flip-flop coupled to the first combinatorial block, the first logic signal being coupled to the first falling edge sampling flip-flop so as to produce a first control signal;

a second falling edge sampling flip-flop coupled to the second combinatorial block, the second logic signal being coupled to the second falling edge sampling flip-flop so as to produce a second control signal; and a logic circuit coupled to the first and second falling edge sampling flip-flops, the first and second control signals and the clocks being coupled to the logic circuit so as to produce an output signal that is connected to a clock input of the RAM.

9. The control circuit as defined in claim 8, wherein the control circuit includes:

a first AND gate coupled to the first falling edge sampling flip-flop, the first control signal and the clock of the bus in control of the control flip-flop being coupled to the first AND gate;

a second AND gate coupled to the second falling edge sampling flip-flop, the second control signal and the clock of the bus not in control of the control flip-flop being coupled to the second AND gate; and an OR gate coupled to the first and second AND gates, outputs of the first and second AND gates being coupled to the OR gate, the output of the OR gate being coupled to a clock input of the RAM.

10. The control circuit as defined in claim 8, further comprising multiplexers for communicating with the single port RAM, the first and second logic signals being used to control the multiplexers.

11. The control circuit as defined in claim 8, further comprising:
a third combinatorial block that receives the first and second logic signals and produces a select signal; and
multiplexers for communicating with the single port RAM, the select signal being used to control the multiplexers.

12. The control circuit as defined in claim 11, wherein the third combinatorial block comprises a protection to avoid the first and second logic signals being active simultaneously.

13. A communication device comprising at least one control circuit as defined in claim 8.

14. A computer device comprising at least one control circuit as defined in claim 8.

* * * * *